(12) United States Patent
Menolfi et al.

(10) Patent No.: US 7,679,459 B2
(45) Date of Patent: Mar. 16, 2010

(54) MULTIPHASE SIGNAL GENERATOR

(75) Inventors: Christian I. Menolfi, Langnau am Albis (CH); Martin Leo Schmatz, Rueschlikon (CH); Thomas H. Toifl, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 11/962,681

(22) Filed: Dec. 21, 2007

(65) Prior Publication Data
US 2009/0002082 A1 Jan. 1, 2009

(30) Foreign Application Priority Data
Dec. 22, 2006 (EP) ................................. 06127032

(51) Int. Cl.
*H03B 27/00* (2006.01)
(52) U.S. Cl. .......................................... 331/57; 331/45

(58) Field of Classification Search ................... 331/56, 331/45, 57
See application file for complete search history.

(56) References Cited
U.S. PATENT DOCUMENTS
7,183,864 B1 * 2/2007 Gutnik ........................ 331/57
* cited by examiner

*Primary Examiner*—Joseph Chang
(74) *Attorney, Agent, or Firm*—Kenneth R. Corsello; Anne Vachon Dougherty

(57) ABSTRACT

A signal generator for generating multiple phases includes a ring oscillator with at least one first adjustable delay stage and at least one second delay stage being serially arranged, wherein an output of the first delay stage is provided for delivering at least one first output phase and an output of the second delay stage is provided for delivering at least one second output phase, and an adjustment circuit for adjusting the delay of the first adjustable delay stage, wherein the adjustment circuit is provided for adjusting the phase relationship between the first output phase and the second output phase by means of setting a first propagation delay for the first delay stage.

14 Claims, 9 Drawing Sheets

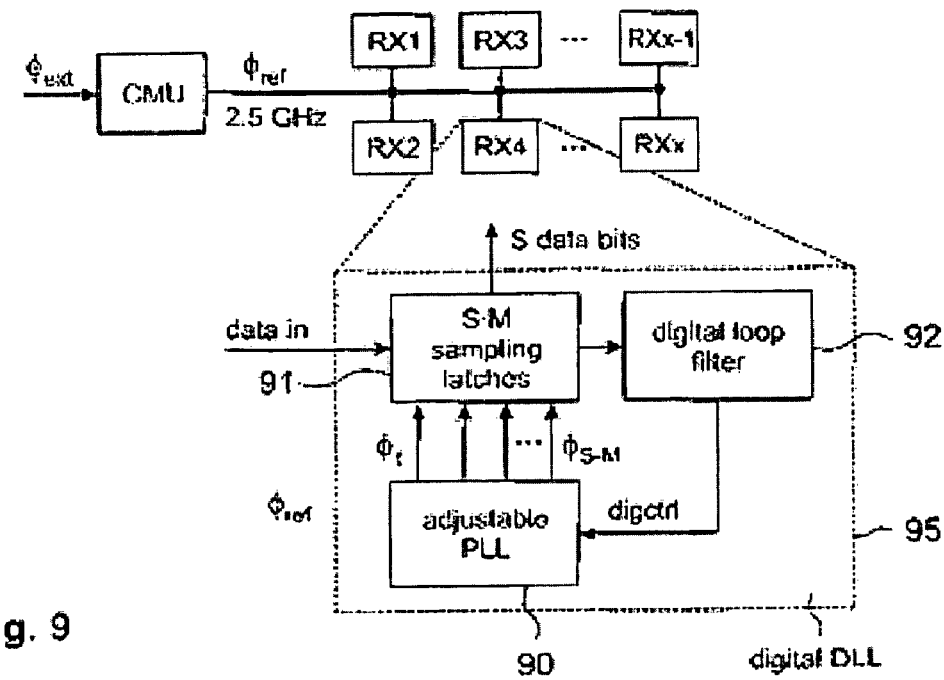
Fig. 9
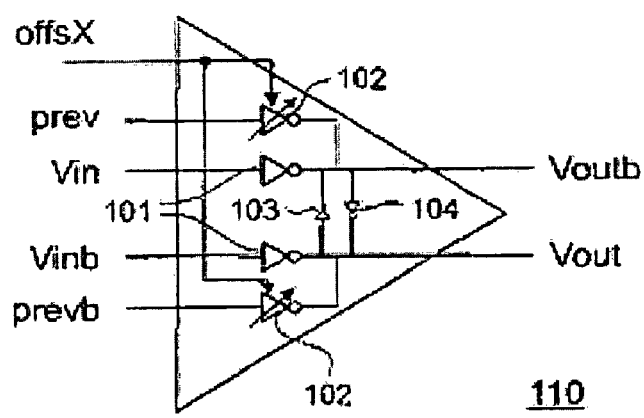
Fig. 11        110

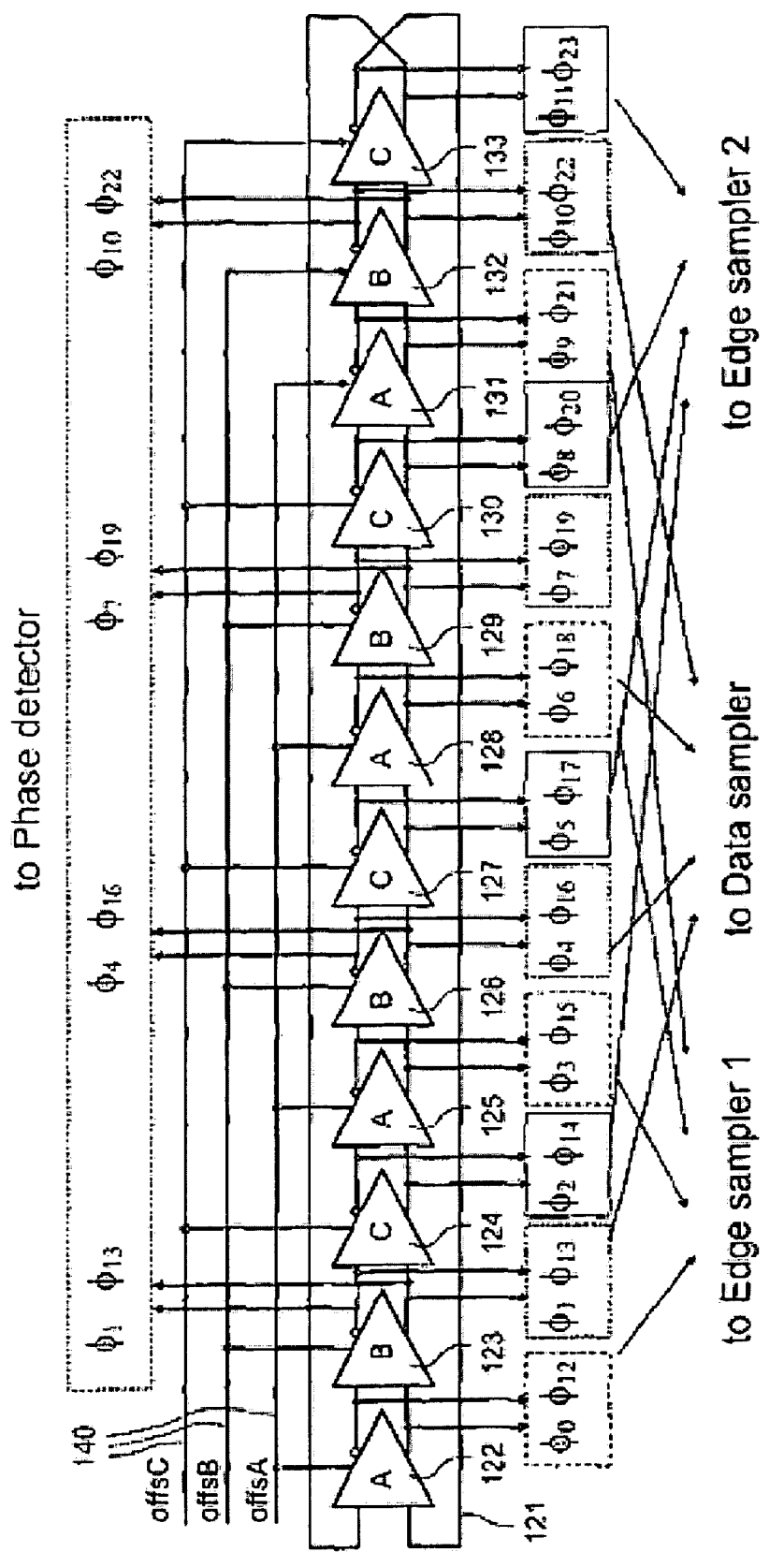

MULTIPHASE SIGNAL GENERATOR

TECHNICAL FIELD

The present invention relates to a signal generator for generating multiple phases. The present invention further relates to a phase locked loop, a clock and data recovery system and a receiver comprising the signal generator for generating multiple phases.

BACKGROUND OF THE INVENTION

Multiphase signal generators are provided for generating a plurality of output phases. They are widely used in many communication systems and devices, e.g. in phase locked loops, clock and data recovery systems, receivers and high-speed serial data links.

In particular multi-Gigabit receivers of high-speed serial links demand for highly precise clock generation. High-speed serial links are used to transmit data from chip to chip over wired media, such as a printed circuit board or a backplane. The aggregate data rates in future chip to chip communication will soon reach several Tbits/s in some applications. Since serial links are analog in nature, ordinary scaling in power and area, as seen for digital logic, does not apply. Hence, the relative area and power consumption of the chip input/output interface versus logic is increasing. On the receiver side, most power is spent for clock generation. In consequence, it is a challenge to find serial link receiver architectures which minimizes area and power consumption.

In high-speed links, sub-rate receiver architectures are frequently used. This allows clocking the receiver at an integer fraction 1/S of the data rate, thereby relaxing the requirements on the sampling latches and the clock distribution circuitry. Thus, sub-rate receivers allow exploring the speed limits of a given technology and reducing the power consumption.

Typical values for S range between 2 and 8. One solution for highly precise clock generation is an adjustable phase locked loop (PLL) comprising a multiphase signal generator.

Such an adjustable phase locked loop is described in "Thomas Toifl, Christian Menolfi, Peter Buchmann, Marcel Kossel, Thomas Morf, Robert Reutemann, Michael Ruegg, Martin L. Schmatz, Jonas Weiss, A 0.94-ps-RMS-Jitter 0.016-mm2 2.5-GHz Multiphase Generator PLL with 360 Digitally Programmable Phase Shift for 10-Gb/s Serial Links, IEEE JOURNAL OF SOLID STATE CIRCUITS, Vol. 40, No. 12, DECEMBER 2005.

It is an object of the invention to provide an improved multiphase signal generator. A further object is to provide a phase locked loop, a clock and data recovery system and a receiver with enhanced data signal quality. A further object is to provide a phase locked loop, a clock and data recovery system and a receiver with reduced chip area and power consumption.

SUMMARY AND ADVANTAGES OF THE INVENTION

The present invention is directed to a signal generator, a phase locked loop, a clock and data recovery system and a receiver as defined in independent claims. Further embodiments of the invention are provided in the appended dependent claims.

According to a first aspect of the present invention, there is presented a signal generator for generating multiple phases, comprising a ring oscillator with at least one first adjustable delay stage and at least one second delay stage being serially arranged, wherein an output of the first delay stage is provided for delivering at least one first output phase and an output of the second delay stage is provided for delivering at least one second output phase, an adjustment circuit for adjusting the delay of the first adjustable delay stage, wherein the adjustment circuit is provided for adjusting the phase relationship between the first output phase and the second output phase by means of setting a first propagation delay for the first delay stage.

The signal generator according to this aspect of the invention allows for a control and adjustment of the phase relationship, in particular the phase difference, between the first and the second output phase. This improves the flexibility and applicability of the signal generator. The adjustment of the phase relationship can be used to adapt the signal generator to the specific features and needs of the application. As an example, the adjustment of the phase relationship can be used to adapt the signal generator to the specific properties of the allocated transmission channel.

According to an embodiment of this aspect of the invention the second delay stage comprises an adjustable delay stage, wherein the adjustment circuit is provided for adjusting the delay of the first and the second adjustable delay stage and wherein the adjustment circuit is provided for adjusting the phase relationship between the first output phase and the second output phase by means of setting a first propagation delay for the first delay stage and a second propagation delay for the second delay stage.

According to this embodiment of the invention the phase relationship between the first output phase and the second output phase can be adjusted in two directions.

According to a further embodiment of this aspect of the invention the first output phase is provided for delivering a data sampling clock signal to a sampling unit and the second output phase is provided for delivering an edge sampling clock signal to the sampling unit.

The signal generator according to this embodiment of the invention allows adjusting the timing between data and edge samples. This allows taking into account that for a given transmission channel the maximum vertical eye opening is not necessarily in the middle of the data eye. In other words, an improved signal quality can be reached by adjusting the phase relationship between the data and the edge samples. The maximum eye opening does not necessarily occur in the very middle of the data eye. Dependent on the respective application, the desired adjustable range of data to edge sample timing can be provided. One preferred range provides an adjustable data sample to edge sample timing range of 0.35-0.65 Unit Intervals (UI). Another preferred range provides an adjustable data sample to edge sample timing range of 0.2-0.5 Unit Intervals. The latter range is in particular suited for applications that use a decision-feedback equalizer (DFE) in the data path.

According to a further embodiment of the invention the ring oscillator comprises a first group of adjustable delay stages and a second group of delay stages being serially arranged in an alternating way, wherein the output of the first group of delay stages is provided for delivering a first set of output phases and the output of the second group of delay stages is provided for delivering a second set of output phases, wherein the adjustment circuit is provided for adjusting the delay of the first group of adjustable delay stages, wherein the adjustment circuit is provided for adjusting the phase relationship between the first set of output phases and the second set of output phases by means of setting a first propagation delay for the first group of delay stages.

This embodiment of the invention allows the generation of a plurality of output phases. The first set of output phases may comprise two or more output phases and the second set of output phases may comprise two or more output phases. By means of the number of delay stages the number of output phases can be adapted to the respective application of the signal generator. As an example, the first group of delay stages and the second group of delay stages may comprise each two delay stages. This means that there is provided a serial arrangement of a first delay stage of the first group, a first delay stage of the second group, a second delay stage of the first group and a second delay stage of the second group. The first delay stage of the first group, the first delay stage of the second group, the second delay stage of the first group and the second delay stage of the second group may provide each at least one output phase. In other words, by providing two groups comprising each two delay stages, at least four output phases can be generated.

According to a further embodiment of the invention the second group of delay stages comprises adjustable delay stages and the adjustment circuit is provided for adjusting the delay of the first and the second group of adjustable delay stages, wherein the adjustment circuit is provided for adjusting the phase relationship between the first set of output phases and the second set of output phases by means of setting a first propagation delay for the first group of delay stages and a second propagation delay for the second group of delay stages.

According to this embodiment of the invention the phase relationship between the first set of output phases and the second set of output phases can be adjusted in two directions.

According to a further embodiment of the invention the first group of delay stages or the second group of delay stages is provided for delivering a third set of output phases.

As the third set of output phases is derived either from the first group of delay stages or the second group of delay stages, the third set of output phases is equidistantly spaced. This is achieved by the alternating arrangement of the first group of delay stages and the second group of delay stages. The alternating arrangement results in a compensation of the different propagation delays of the first group of delay stages and the second group of delay stages for the third set of output phases. In other words, between the delay stages of the first group and the delay stages of the second group there is always provided a fast delay stage and a slow delay stage or the same number of fast and slow delay stages. These fast and slow delay stages compensate each other. This allows using the third set of delay stages for applications that require equidistantly spaced phase signals.

According to a further embodiment of the invention the signal generator comprises at least one first pair of adjustable delay stages and at least one second pair of adjustable delay stages, wherein the output of the second delay stage of the first pair is provided for delivering a first set of output phases and the output of the second delay stage of the second pair is provided for delivering a second set of output phases, and wherein the output of the first delay stage of the first pair and the output of the first delay stage of the second pair is provided for delivering a third set of output phases.

Arranging adjustable delay stages in pairs increases the number of available output phases As an example, the first pair may comprise two slow delay stages and the second pair two fast delay stages. Between the output of the first delay stage of the first pair and the output of the first delay stage of the second pair is arranged a slow delay stage followed by a fast delay stage which compensate each other. The output phases of the first delay stage of the first pair and the first delay stage of the second pair are hence equidistantly spaced.

According to a further embodiment of the invention the third set of output phases is provided for generating multiple phase shifted output signals to a phase detector of a phase locked loop.

This allows designing systems and circuits with low clock frequencies, but many clock phases. Furthermore, it facilitates low power and low area circuit design.

According to a further embodiment of the invention the ring oscillator comprises three or more groups of adjustable delay stages being serially arranged in an alternating way, wherein the outputs of the three or more groups of adjustable delay stages are provided for delivering three or more sets of output phases, wherein the adjustment circuit is provided for adjusting the delay of the three or more groups of adjustable delay stages, wherein the adjustment circuit is provided for adjusting the phase relationship between the three or more sets of output phases by means of setting different propagation delays for the three or more groups of adjustable delay stages.

The signal generator according to this embodiment of the invention can e.g. be used for applications with an oversampling factor M of 3 or more.

According to a further embodiment of the invention the ring oscillator is a differential ring oscillator.

According to this embodiment of the invention each of the delay stages of the differential ring oscillator may provide a differential pair of output signals. This provides the possibility to use both output signals of the differential delay stages as output phases. Hence the number of available output phases can be further increased. Preferably the outputs of the last delay stage of the differential ring oscillator are cross-coupled to the inputs of the first delay stage. As an example, the upper output of the last delay stage is coupled to the lower input of the first delay stage and vice versa. This allows for providing a ring oscillator with an even number of delay stages.

A second aspect of the invention relates to a phase locked loop comprising as voltage controlled oscillator a signal generator according to the first aspect of the invention.

This allows the design of communication systems and circuits with low clock frequencies, but many clock phases. Furthermore, it facilitates low power and low area circuit design.

According to an embodiment of the second aspect of the invention the voltage controlled oscillator is provided for generating multiple phase shifted output signals, wherein the phase locked loop further comprises
  multiple phase detectors to determine the phase differences between the output signals and a reference clock,
  a weighting device to weight the phase differences and generating a control signal for the voltage controlled oscillator.

By means of such a PLL design the clock path from the VCO to the sampling latches can be reduced and a very small tracking jitter due to its high PLL bandwidth may be provided.

A coarse phase adjustment can be readily achieved by switching on only one of the multiple phase detectors, thereby locking to one of the multiple phases. The 360 degrees circle is divided into multiple coarse phase positions. A fine adjustment of the phase can be achieved by multiplying the output voltages of the multiple phase-detectors by the weighting factors and by summing the resulting voltages. At each time, always two adjacent phase detectors are active. Hence, it is possible to interpolate between two coarse phase positions just by adapting the weighting factors. The voltage after the summation may be converted to a current by a voltage to current converter.

A third aspect of the invention relates to a clock and data recovery (CDR) system comprising a phase locked loop according to the second aspect of the invention.

Using the signal generator according to the first aspect of the invention in a clock and data recovery system facilitates low power and low area circuit design of such a system. Furthermore, it improves the performance of the CDR system in terms of data signal quality.

The clock and data recovery system may comprise multiple sampling latches which are capable of intermediately storing received data and which are coupled to the voltage controlled oscillator.

A fourth aspect of the invention relates to a receiver for a serial data link comprising a phase locked loop according to the first aspect of the invention.

Using the signal generator according to the first aspect of the invention in a receiver facilitates low power and low area circuit design of such a receiver and of serial data links. Furthermore, it improves the performance of the receiver and the serial data links in terms of the data signal quality.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating:

FIG. 12 a block diagram of a multiphase signal generator comprising 3 sets of adjustable delay stages according to an embodiment of the invention,

DETAILED DESCRIPTION OF THE DRAWINGS

Figure 1:
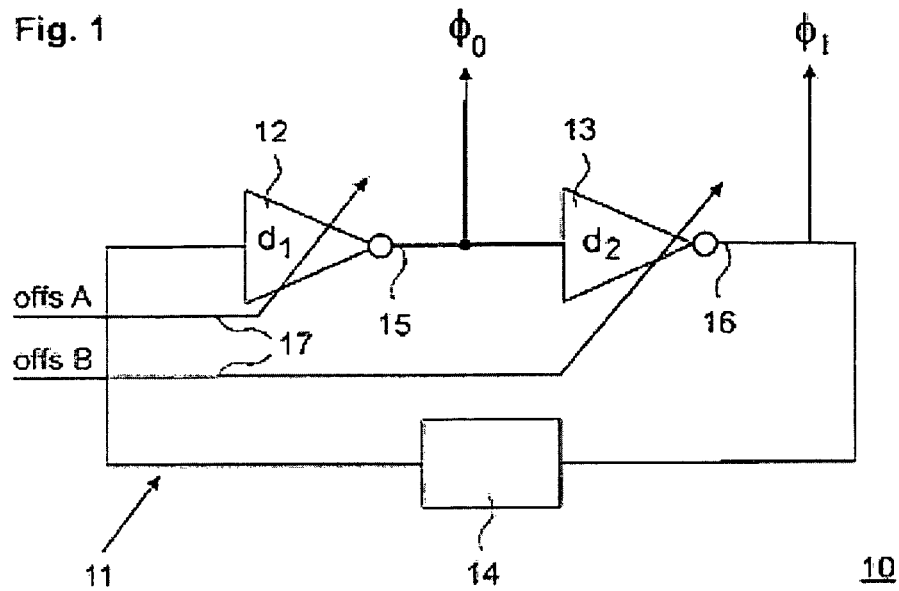
FIG. 1 a block diagram of a multiphase signal generator comprising a first adjustable delay stage and a second adjustable delay stage according to an embodiment of the invention, FIG. 2 a block diagram of a differential multiphase signal generator comprising a first adjustable delay stage and a second adjustable delay stage according to an embodiment of the invention, FIG. 3 a block diagram of a multiphase signal generator comprising a first pair and a second pair of adjustable delay stages according to an embodiment of the invention, FIG. 4 a block diagram of a multiphase signal generator comprising four pairs of adjustable delay stages according to an embodiment of the invention, FIG. 5 a block diagram of a multiphase signal generator comprising 8 adjustable delay stages according to an embodiment of the invention, FIG. 6 the simulated data to edge timing offset of the signal generator of FIG. 4 as a function of the programmed value.

FIG. 1 shows a schematic block diagram of a signal generator 10 according to an embodiment of the invention. The signal generator 10 comprises a ring oscillator 11 with a first adjustable delay stage 12 and a second adjustable delay stage 13 being serially arranged. The signal generator 10 may comprise further elements 14, e.g. to facilitate the oscillation.

The output 15 of the first delay stage 12 is provided for delivering a first output phase $\phi_0$ and the output 16 of the second delay stage 13 is provided for delivering a second output phase $\phi_1$.

The signal generator 10 comprises an adjustment circuit 17 for adjusting the propagation delay of the first adjustable delay stage 12 and the second adjustable delay stage 13.

The adjustment circuit 17 is further provided for adjusting the phase relationship between the first output phase $\phi_0$ and the second output phase $\phi_1$ by means of setting a first propagation delay $d_1$ for the first delay stage 12 and a second propagation delay $d_2$ for the second delay stage. The adjustment circuit 17 adjusts the first propagation delay $d_1$ for the first delay stage 12 by means of an offset signal offsA and the second propagation delay $d_2$ by means of an offset signal offsB.

The first delay stage 12 and the second delay stage 13 may be based on CMOS inverters.

Figure 2:
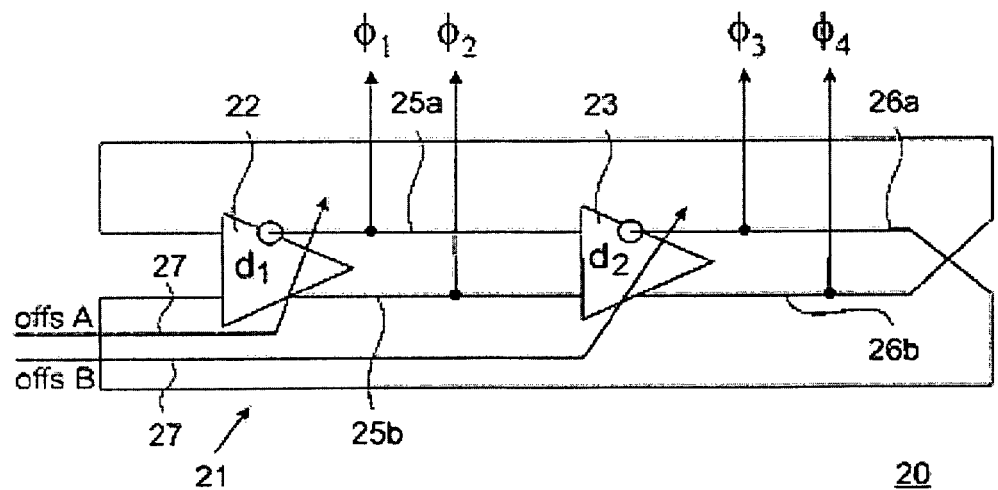

FIG. 2 shows a schematic block diagram of a signal generator 20 according to a further embodiment of the invention. The signal generator 20 comprises a ring oscillator 21 with a first adjustable delay stage 22 and a second adjustable delay stage 23 being serially arranged. The signal generator 20 is a differential or pseudo-differential signal generator. The first delay stage 22 comprises an output 25a for delivering a first output phase $\phi_1$ and an output 25b for delivering a second output phase $\phi_2$. The second delay stage 23 comprises an output 26a for delivering a third output phase $\phi_3$ and an output 26b for delivering a fourth output phase $\phi_4$.

The first output phase $\phi_1$ and the second output phase $\phi_2$ establish a first set of output phases. The third output phase $\phi_3$ and the fourth output phase $\phi_4$ establish a second set of output phases.

The signal generator 20 comprises an adjustment circuit 27 for adjusting the propagation delay of the first adjustable delay stage 22 and the second adjustable delay stage 23.

The adjustment circuit 27 is further provided for adjusting the phase relationship between the first set of output phases $\phi_1$, $\phi_2$ and the second set of output phases $\phi_3$, $\phi_4$ by means of setting a first propagation delay $d_1$ for the first delay stage 22 and a second propagation delay $d_2$ for the second delay stage 23. The adjustment circuit 27 adjusts the first propagation delay $d_1$ for the first delay stage 22 by means of an offset signal offsA and the second propagation delay $d_2$ by means of an offset signal offsB.

Figure 3:
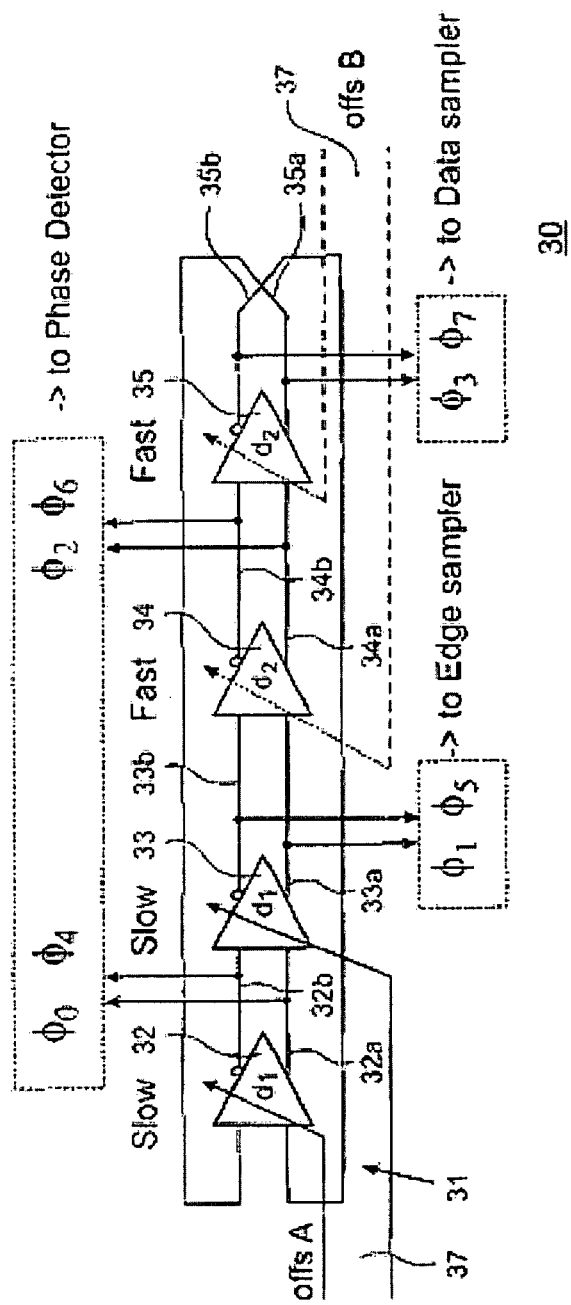
Figure 3:
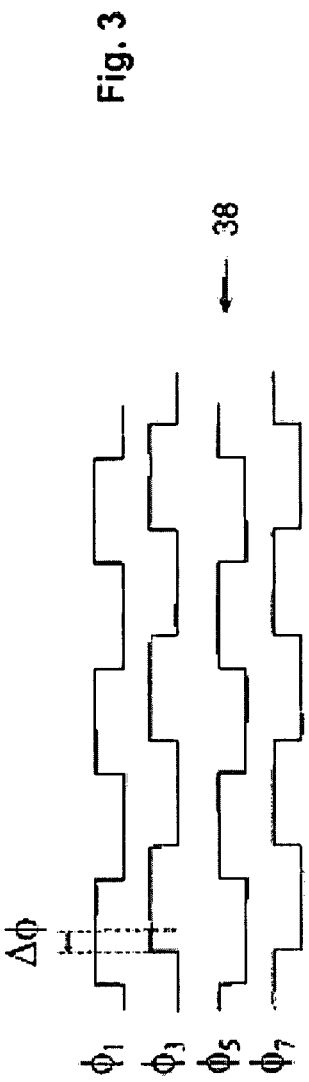

FIG. 3 shows a schematic block diagram of a signal generator 30 according to a further embodiment of the invention. The signal generator 30 comprises a ring oscillator 31 with a first pair of adjustable delay stages 32, 33 and a second pair of adjustable delay stages 34, 35.

The signal generator 30 is a differential or pseudo-differential signal generator.

The first delay stage 32 of the first pair comprises an output 32a for delivering an output phase $\phi_0$ and an output 32b for delivering an output phase $\phi_4$. The second delay stage 33 of the first pair comprises an output 33a for delivering an output phase $\phi_1$ and an output 33b for delivering an output phase $\phi_5$. The first delay stage 34 of the second pair comprises an output 34a for delivering an output phase $\phi_2$ and an output 34b for delivering an output phase $\phi_6$. The second delay stage 35 of the second pair comprises an output 35a for delivering an output phase $\phi_3$ and an output 35b for delivering an output phase $\phi_7$.

The output phases $\phi_1$, $\phi_5$ establish a first set of output phases, the output phases $\phi_3$, $\phi_7$ establish a second set of output phases and the output phases $\phi_0$, $\phi_4$, $\phi_2$ and $\phi_6$ establish a third set of output phases.

The first set of output phases $\phi_1$, $\phi_5$ is provided for delivering a data sampling clock signal to a not shown sampling unit and the second set of output phases $\phi_3$, $\phi_7$ is provided for delivering an edge sampling clock signal to a not shown sampling unit. The third set of output phases $\phi_0$, $\phi_4$, $\phi_2$ and $\phi_6$ is provided for delivering phase shifted output signals to a not shown phase detector of a phase locked loop.

An adjustment circuit 37 is provided for adjusting the phase relationship between the first set of output phases $\phi_1$, $\phi_5$ and the second set of output phases $\phi_3$, $\phi_7$ by means of setting a first propagation delay $d_1$ for the first pair of delay stages 32, 33 and a second propagation delay $d_2$ for the second pair of delay stages 34, 35. The adjustment circuit 37 adjusts the first propagation delay $d_1$ by means of an offset signal offsA and the second propagation delay $d_2$ by means of an offset signal offsB.

In this example it is assumed that the first propagation delay $d_1$ is greater than the second propagation delay $d_2$. Hence the first pair of delay stages 32, 33 is slower than the second pair of delay stages 34, 35 which is denoted by the terms "fast" and "slow" in FIG. 3. The lower part 38 of FIG. 3 illustrates the phase relationship between the first set of output phases $\phi_1$, $\phi_5$ and the second set of output phases $\phi_3$, $\phi_7$. As in this example the first propagation delay $d_1$ is greater than the second propagation delay $d_2$, the data to edge sample timing is shifted by the phase difference $\Delta\phi$ from the nominal value of 0.5 Unit Intervals (UIs).

The third set of output phases $\phi_0$, $\phi_4$, $\phi_2$ and $\phi_6$ are equidistantly spaced as there is a slow delay stage 33 and a fast delay stage 34 between the output phases $\phi_0$, $\phi_4$ and $\phi_2$, $\phi_6$ and as there is fast delay stage 35 and a slow delay stage 32 between the output phases $\phi_2$, $\phi_6$ and $\phi_0$, $\phi_4$. Hence the alternating fast and slow delay stages compensate each other.

The signal generator 30 may preferably be used in a half rate receiver.

Figure 4:
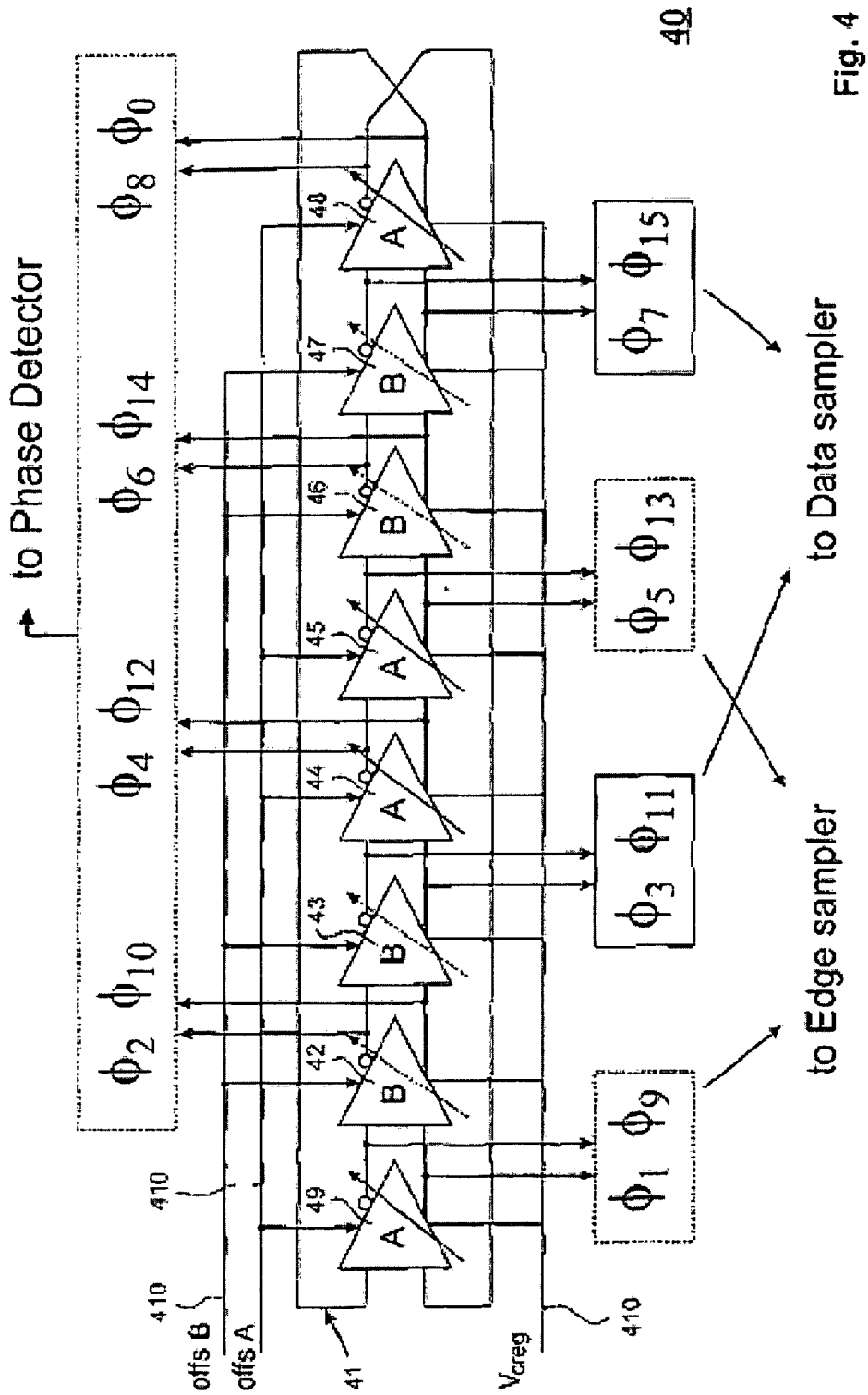

FIG. 4 shows a schematic block diagram of a signal generator 40 according to a further embodiment of the invention. The signal generator 40 may be used as quarter rate receiver. The signal generator 40 comprises a ring oscillator 41 with a first pair of adjustable delay stages 42, 43, a second pair of adjustable delay stages 44, 45, a third pair of adjustable delay stages 45, 46 and a fourth pair of adjustable delay stages 47, 48.

The signal generator 40 is a differential or pseudo-differential signal generator.

The delay stage 42 comprises outputs for delivering output phases $\phi_2$ and $\phi_{10}$. The delay stage 43 comprises outputs for delivering output phases $\phi_3$ and $\phi_{11}$. The delay stage 44 comprises outputs for delivering output phases $\phi_4$ and $\phi_{12}$. The delay stage 45 comprises outputs for delivering output phases $\phi_5$ and $\phi_{13}$. The delay stage 46 comprises outputs for delivering output phases $\phi_6$ and $\phi_{14}$. The delay stage 47 comprises outputs for delivering output phases $\phi_7$ and $\phi_{15}$. The delay stage 48 comprises outputs for delivering output phases $\phi_0$ and $\phi_8$. The delay stage 49 comprises outputs for delivering output phases $\phi_1$ and $\phi_9$.

The output phases $\phi_3$, $\phi_{11}$, $\phi_7$, $\phi_{15}$ establish a first set of output phases, the output phases $\phi_1$, $\phi_9$, $\phi_5$, $\phi_{13}$ establish a second set of output phases and the output phases $\phi_2$, $\phi_{10}$, $\phi_4$, $\phi_{12}$, $\phi_6$, $\phi_{14}$, $\phi_8$, $\phi_0$ establish a third set of output phases.

The first set of output phases $\phi_3$, $\phi_{11}$, $\phi_7$, $\phi_{15}$ is provided for delivering a data sampling clock signal to a not shown sampling unit and the second set of output phases $\phi_1$, $\phi_9$, $\phi_5$, $\phi_{13}$ is provided for delivering an edge sampling clock signal to a not shown sampling unit. The third set of output phases $\phi_2$, $\phi_{10}$, $\phi_4$, $\phi_{12}$, $\phi_6$, $\phi_{14}$, $\phi_8$, $\phi_0$ is provided for delivering phase shifted output signals to a not shown phase detector of a phase locked loop.

An adjustment circuit 410 is provided for adjusting the phase relationship between the first set of output phases $\phi_3$, $\phi_{11}$, $\phi_7$, $\phi_{15}$ and the second set of output phases $\phi_1$, $\phi_9$, $\phi_5$, $\phi_{13}$ by means of setting a first propagation delay $d_1$ for the delay stages 42, 43, 46 and 47 and a second propagation delay $d_2$ for the second pair of delay stages 44, 45, 48 and 49.

The adjustment circuit 37 adjusts the first propagation delay $d_1$ by means of an offset signal offsA and the second propagation delay $d_2$ by means of an offset signal offsB. Accordingly the delay stages are denoted either with A or B. The signal generator 40 is implemented as voltage controlled oscillator (VCO). To each of the delay stages 42 to 49 there is supplied a regulated VCO supply voltage $V_{creg}$.

The phases of the third set of output phases $\phi_2$, $\phi_{10}$, $\phi_4$, $\phi_{12}$, $\phi_6$, $\phi_{14}$, $\phi_8$, $\phi_0$ are equidistantly spaced as there is always a slow delay stage and a fast delay stage between subsequent output phases.

Figure 5:
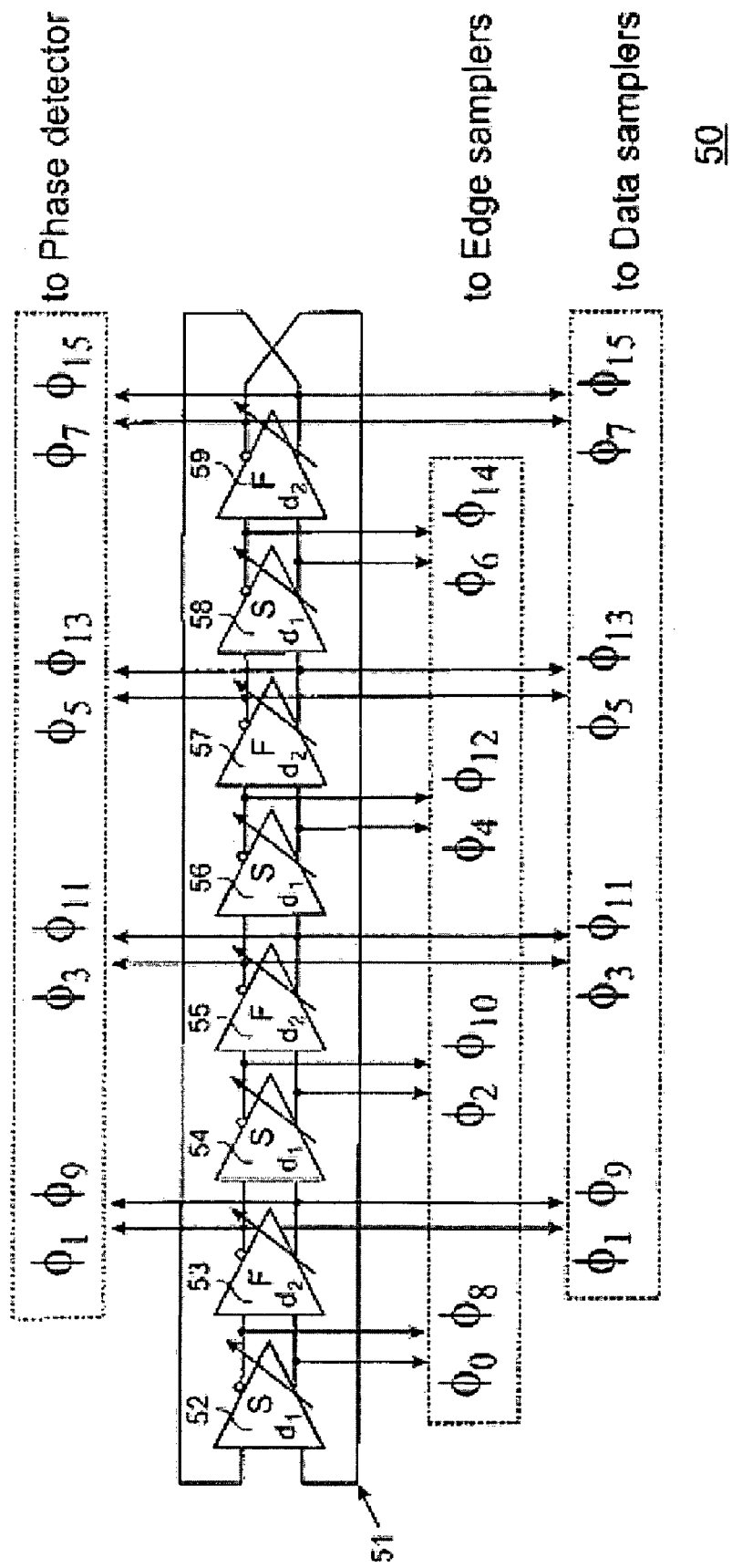

FIG. 5 shows a schematic block diagram of a signal generator 50 according to a further embodiment of the invention. The signal generator 50 may be used in an octal rate receiver. The signal generator 50 comprises a ring oscillator 51 with 8 adjustable delay stages 52, 53, 54, 55, 56, 57, 58 and 59. The signal generator 50 is a differential or pseudo-differential signal generator.

The delay stage 52 comprises outputs for delivering output phases $\phi_0$ and $\phi_8$. The delay stage 53 comprises outputs for delivering output phases $\phi_1$ and $\phi_9$. The delay stage 54 comprises outputs for delivering output phases $\phi_2$ and $\phi_{10}$. The delay stage 55 comprises outputs for delivering output phases $\phi_3$ and $\phi_{11}$. The delay stage 56 comprises outputs for delivering output phases $\phi_4$ and $\phi_{12}$. The delay stage 57 comprises outputs for delivering output phases $\phi_5$ and $\phi_{13}$. The delay stage 58 comprises outputs for delivering output phases $\phi_6$ and $\phi_{14}$. The delay stage 59 comprises outputs for delivering output phases $\phi_7$ and $\phi_{15}$.

The output phases $\phi_1$, $\phi_9$, $\phi_3$, $\phi_{11}$, $\phi_5$, $\phi_{13}$, $\phi_7$, $\phi_{15}$ establish a first set of output phases and in parallel a third set of output phases. The output phases $\phi_0$, $\phi_8$, $\phi_2$, $\phi_{10}$, $\phi_4$, $\phi_{12}$, $\phi_6$, $\phi_{14}$ establish a second set of output phases. The first set of output phases $\phi_1$, $\phi_9$, $\phi_3$, $\phi_{11}$, $\phi_5$, $\phi_{13}$, $\phi_7$, $\phi_{15}$ is provided for delivering a data sampling clock signal to a not shown sampling unit and the second set of output phases $\phi_0$, $\phi_8$, $\phi_2$, $\phi_{10}$, $\phi_4$, $\phi_{12}$, $\phi_6$, $\phi_{14}$ is provided for delivering an edge sampling clock signal to a not shown sampling unit. The third set of output phases $\phi_1$, $\phi_9$, $\phi_3$, $\phi_{11}$, $\phi_5$, $\phi_{13}$, $\phi_7$, $\phi_{15}$ is provided for delivering phase shifted output signals to a not shown phase detector of a phase locked loop.

A not shown adjustment circuit is provided for adjusting the phase relationship between the first set of output phases and the second set of output phases by means of setting a first propagation delay $d_1$ for the delay stages 52, 54, 56 and 58 and a second propagation delay $d_2$ for the delay stages 53, 55, 57 and 59. The first propagation delay $d_1$ is greater than the second propagation delay $d_2$. Hence the delay stages 52, 54, 56 and 58 are denoted as slow "S" delay stages and the delay stages 53, 55, 57 and 59 are denoted as fast "F" delay stages.

The phases of the third set of output phases $\phi_1$, $\phi_9$, $\phi_3$, $\phi_{11}$, $\phi_5$, $\phi_{13}$, $\phi_7$, $\phi_{15}$ are equidistantly spaced as there is always a slow delay stage and a fast delay stage between subsequent output phases.

Figure 6:
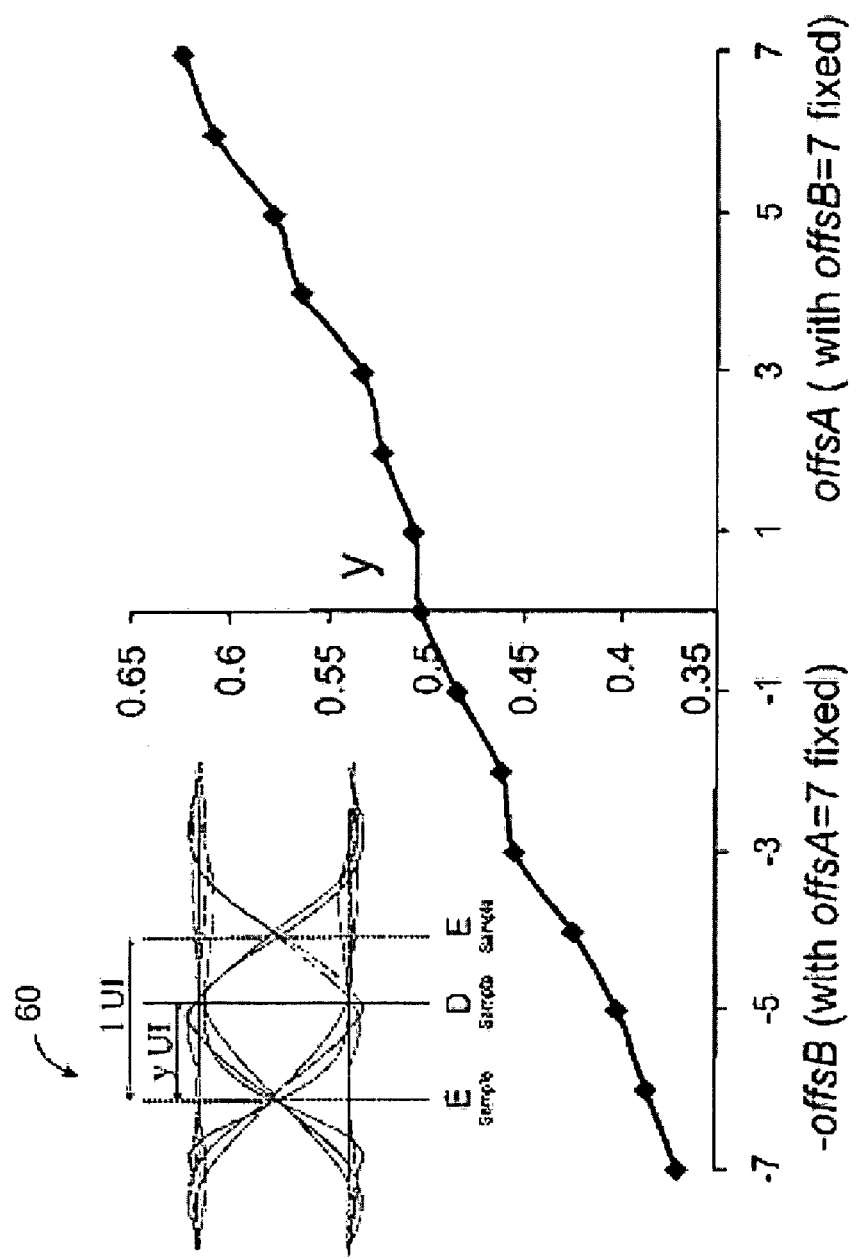

FIG. 6 shows the simulated data to edge timing offset of the signal generator 40 of FIG. 4 as a function of the programmed value. It can be seen that the timing between the data and the edge samples can be adjusted approximately in a range between 0.35 UIs and 0.65 UIs. A Unit Interval (UI) denotes the time between two edge samples.

The data to edge timing adjustment capability allows taking into account that for a given transmission channel the maximum vertical eye opening is not necessarily in the middle of the data eye. This is illustrated in the eye-diagram 60 of FIG. 6. In other words, an improved signal quality can be reached by adjusting the phase relationship between the data and the edge samples.

Figure 7:
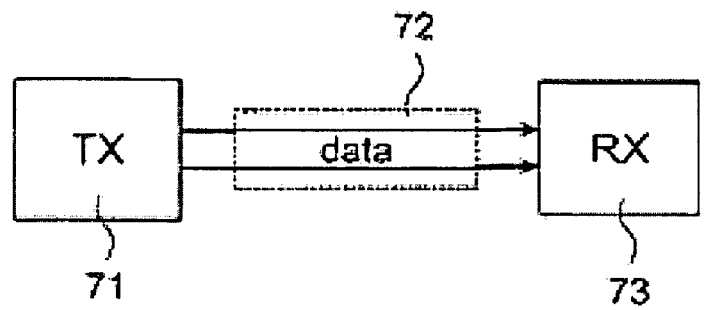
FIG. 7 a block diagram of the basic principle of a serial data link comprising a transmitter and a receiver, FIG. 8 a timing diagram with the sample clocks for sampling an incoming data signal, FIG. 9 a block diagram of an embodiment of a receiver having a clock and data recovery unit according to the invention, FIG. 10 a more detailed block diagram of a phase locked loop with adjustable phase shift according to the invention, FIG. 11 a single voltage controlled oscillator delay stage with feed-forward and cross-coupling.

FIG. 7 shows a schematic block diagram of a high-speed serial link in which a signal generator as described above can be advantageously used. A transmitter 71 is provided for sending data over a data channel 72, which is then received by a receiver 73. Transmitter 71 and receiver 73 can be integrated on-chip. The data channel 72 can be a combination of printed circuit board, connectors, backplane wiring and cable. In general, the receiver 73 has to perform clock recovery to account for variations in the symbol timing.

Figure 8:
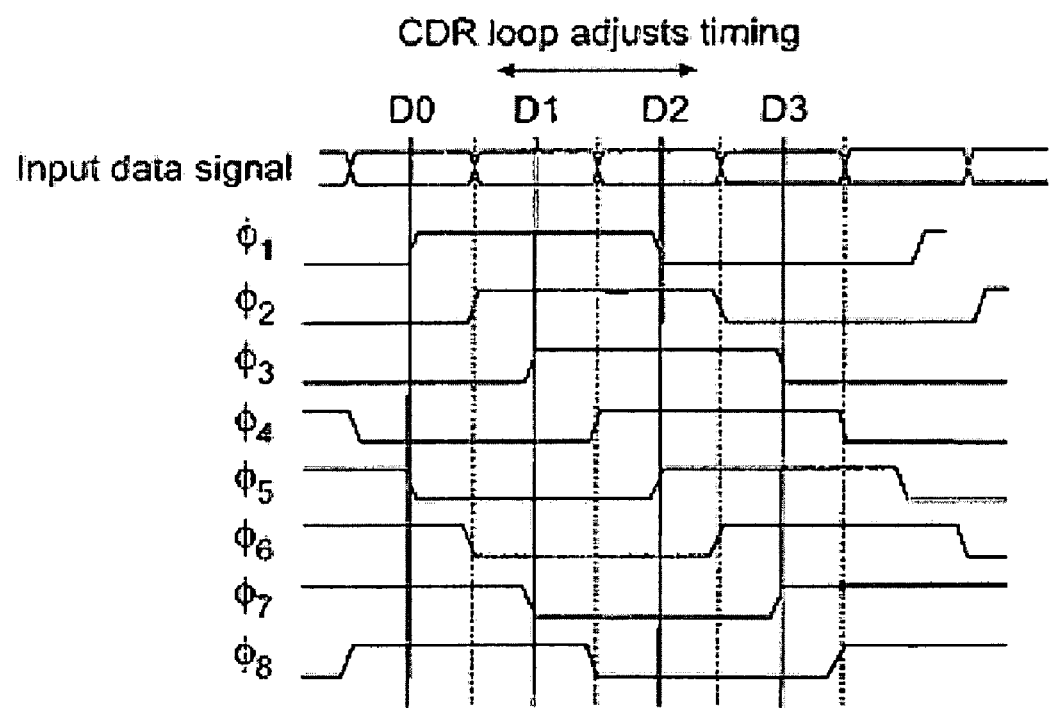

FIG. 8 displays the sample clocks for a quarter rate (S=4) receiver, where four data bits D0 to D3 are sampled in one clock cycle. In order to extract also the timing information the incoming data signal has to be over-sampled, with an over-sampling factor M typically being either 2 or 3, wherein in FIG. 8 M=2. Hence, the clock generator supplies a total number of S×M equidistantly spaced clock phases, i.e. a quarter rate receiver with an over-sampling factor M=2 generates S×M=8 clock phases $\phi_1$ to $\phi_8$ as depicted in FIG. 8. Such a clock generator can be established by means of a signal generator according to an embodiment of the invention. As an example, the 8 clock phases $\phi_1$ to $\phi_8$ of FIG. 8 could be generated by means of the first set of output phases $\phi_3$, $\phi_{11}$, $\phi_7$, $\phi_{15}$ and the second set of output phases $\phi_1$, $\phi_9$, $\phi_5$, $\phi_{13}$ generated by the signal generator 40 of FIG. 4.

Additionally, means should be provided to shift these clocks $\phi_1$ to $\phi_8$ in phase by some controlled amount in order to align the clocks $\phi_1$ to $\phi_8$ to the phase of the incoming data signal. This phase shift should not be limited to a finite phase range in order to allow plesiochronous operation. A plesiochronous operation describes an operation that is almost, but not quite, in synchronization—in other words, almost synchronous.

FIG. 9 shows a block diagram of a multiphase receiver system comprising a phase locked loop with a signal generator according to an embodiment of the invention. In the embodiment according to FIG. 9, an external clock $\phi_{ext}$ is multiplied by a shared on-chip LC-PLL, generating the 2.5 GHz reference clock $\phi_{ref}$ with small jitter, wherein the on-chip LC-PLL is a part of the clock multiplier unit CMU. The reference clock $\phi_{ref}$ is buffered and distributed to several receivers RX1, RX2 to RXx using low-jitter differential signaling, wherein a part of the receiver RX4, namely a clock and data recovery unit 95 is depicted in FIG. 9 and described in the following in more detail. The other receivers RX1, RX2, RX3 and RX5 to RXx can be designed in the same way as receiver RX4. Distributing a high-speed clock $\phi_{ref}$ allows to set the PLL loop bandwidth to high values, hence voltage controlled oscillator noise is suppressed to a high degree. A part of the receiver RX4 is an adjustable PLL 90 with an adjustable phase. In the embodiment according to FIG. 9 for example S·M=2·4=8 equidistant sampling phases $\phi_1$ to $\phi_8$ can be generated and fed to S·M=8 sampling latches of a sampling unit 91. The adjustable PLL 90 allows that all eight clock phases $\phi_1$ to $\phi_8$ are simultaneously shifted by the same programmed amount without the need for additional phase shifting devices. The amount by which the clock phases $\phi_1$ to $\phi_8$ are simultaneously shifted is provided by a digital control signal digctrl derived from a digital loop filter 92. Hence, clock phase generation and phase rotation is combined in a single compact device, minimizing the clock path to the sampling latches 91.

In the proposed circuit, the phase shift is thus achieved by controlling the delay in the feedback path of the PLL.

Using a relatively high frequency on the reference clock $\phi_{ref}$ obsoletes the need for clock multiplication in the clock and data recovery circuit and thus allows locking the adjustable PLL 90 with high bandwidth, thereby minimizing the effects of thermal and power-supply induced noise in the VCO of the adjustable PLL 90.

Figure 10:
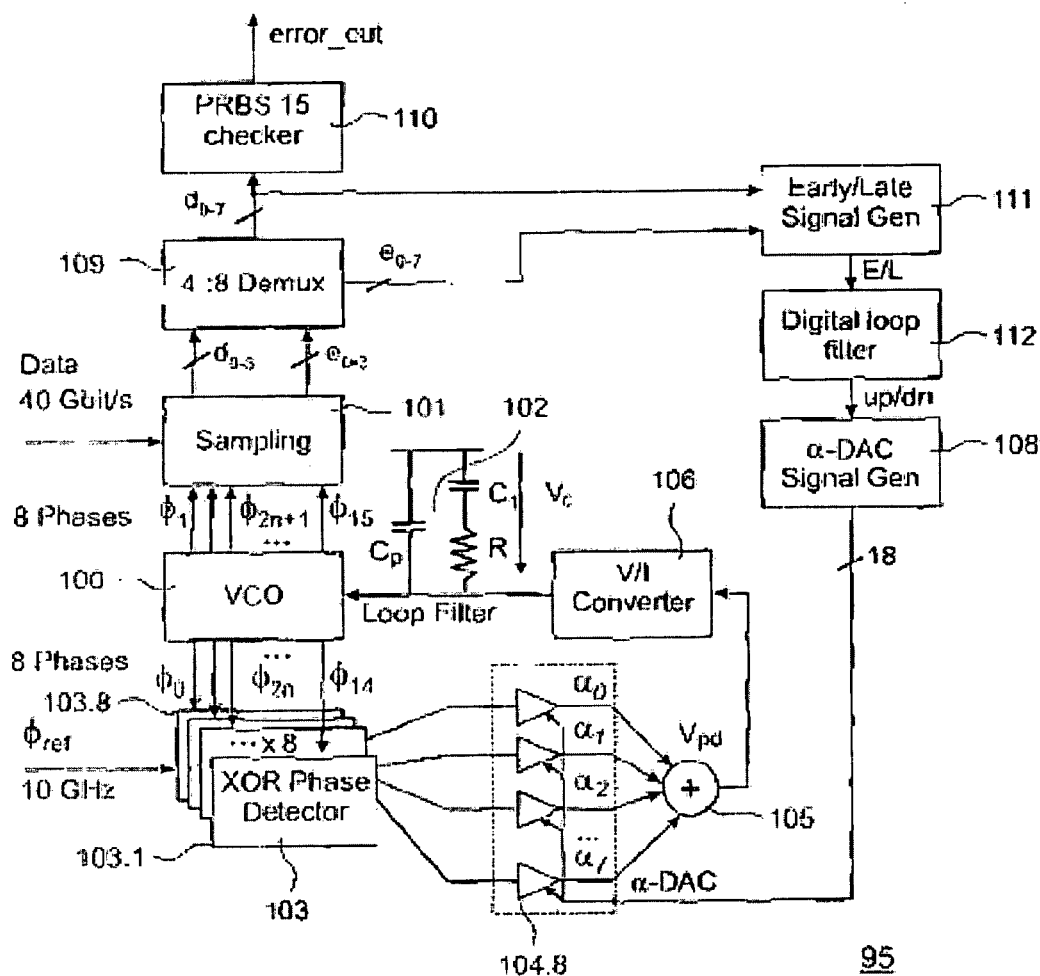

FIG. 10 shows a block diagram of an embodiment of the clock and data recovery unit 95.

In this embodiment a signal generator according to the invention is used as voltage controlled oscillator (VCO) 100. The VCO 100 produces a first and a second set of output phases, also called output signals $\phi_1$, $\phi_{2n+1}$ $\phi_{15}$, which are to be used in a sampling unit 101 of the clock and data recovery unit 95. The VCO frequency is regulated by a VCO control voltage Vc stemming from a loop filter 102. The loop filter 102 is a second order low-pass filter with a resistance R, a capacitance C1 and a ripple capacitance Cp.

The VCO 100 further produces a third set of 8 output phases $\phi_0$, $\phi_{2n}$ to $\phi_{14}$, also called output signals. The eight output phases $\phi_0$, $\phi_{2n}$ to $\phi_{14}$ are used by a phase detector 103, which comprises eight slave phase detectors, also denoted as multiple phase detectors, 103.1 to 103.8. The slave phase detectors 103.1 to 103.8 are of XOR type. Although the minimum number of required slave phase detectors is four, in this implementation, all eight output phases $\phi_0$, $\phi_{2n}$ $\phi_{14}$ are connected to dedicated phase slave detectors 103.1 to 103.8. This provides a high degree of robustness with respect to duty cycle variations on the reference clock $\phi_{ref}$ and the VCO output phases (clocks) $\phi_0$, $\phi_{2n}$ to $\phi_{14}$.

A coarse phase adjustment can be readily achieved by switching on only one of the eight slave phase detectors 103.1 to 103.8, thereby locking to one of the eight output phases $\phi_0$, $\phi_{2n}$ to $\phi_{14}$. Hence, the 360° circle is divided into eight coarse phase positions.

A fine adjustment of the phase can be achieved by multiplying the output values of the slave phase-detectors 103.1 to 103.8 by some weighting factors $\alpha_1$ to $\alpha_8$, and by summing the resulting currents. This is depicted in FIG. 10 by weighting units 104.1 to 104.8 and a summation unit 105, together denoted as weighting device 104.1-104.8. At each time, two adjacent slave phase detectors are active. Hence, it is possible to interpolate between two coarse phase positions by adapting the analog weighting factors $\alpha_1$ to $\alpha_8$.

A voltage Vpd output from the summation unit 105 is converted to a current by means of a voltage-to-current converter 106, working as a charge-pump.

Generally, the VCO 100 produces S·M clock phases $\phi_1$ to $\phi_{S·M}$, which are fed to S·M sampling latches 101 and additionally to a number N of slave phase detectors. This means that the phase detector 103 comprises N slave phase detectors 103.1 to 103.N, where N is an integer divisor of the number of S·M VCO phases $\phi_1$ to $\phi_{S·M}$. In the embodiment according to FIG. 10 the number of slave phase detectors is N=8.

In the following, the slave phase detectors 103.1 to 103.N are also called sub phase detectors or multiple phase detectors.

The loop dynamics of the adjustable PLL 90 is essentially the same as in the case of a PLL with a single XOR phase detector. In general, the XOR phase detector multiplies the input signals, and the resulting output voltage is fed into a voltage to current converter. In the embodiment of FIG. 10 the slave XOR phase detector 103.1 multiplies the input signal $\phi_1$ and the reference clock $\phi_{ref}$, whereas the slave XOR phase detector 103.2 multiplies the input signal $\phi_2$ and the reference clock $\phi_{ref}$. The same can be applied analogously to the slave XOR phase detectors 103.3 to 103.8. The voltage to current converter 106 is equivalent to a charge pump which steers a current Icp in and out the loop filter 102.

The weighting factors $\alpha_n$ are set by controlling the currents in the phase detector 103 with an integrated Digital Analog Converter (DAC) 108. To achieve the required phase resolution, the DAC 108 consists of 8 thermometer-coded bits plus 2 binary-coded bits, generating a total of 35 fine steps between 2 octants. This results in 280 steps for a 100 ps reference clock period, or 70 steps for a UI of 25 ps. By using a phase-programmable PLL approach, phase rotators, conventionally used in dual-loop CDR architecture, can be avoided and the clock path is minimized. The PLL is locked to a 10 GHz reference clock with >1 GHz bandwidth, which to a high degree suppresses the noise of the VCO 100. The 8 even VCO phases $\phi_0$, $\phi_{2n}$ to $\phi_{14}$ of the third set of output phases enter the phase detector 103. The 8 odd phases $\phi_1$, $\phi_{2n+1}$ $\phi_{15}$ of the first and the second set of output phases are used in the sampling unit 101 that creates 4 data d0-3, and 4 edge samples, e0-3, in every clock cycle. The sampling unit 101 is followed by a 4:8 Demultiplexer 109, generating 8 data and 8 edge samples at a rate of 5 GHz. The data bits are fed to an integrated PRBS 15 checker 110, generating an error signal when any of the 8 data bits is incorrectly received, which may then be sent to the chip output. The phase tracking loop is implemented by a digital DLL. An early/late-signal-generation logic 111 generates a single early or late signal from the 8 data bits, d0-7, and 8 edge bits, e0-7, by a 2-step majority vote, which is then accumulated in a digital loop filter 112. A phase step (up or down) is induced when the overhang of early or late signals is greater than 4. The phase position is then encoded in the digital control bits to set the weighting factors $\alpha_n$ in the DAC 108.

The VCO 100 may be implemented by means of a signal generator 40 as shown in FIG. 4. The VCO 100 may be based on a regulated ground approach, where an operational amplifier regulates the ground potential Vcreg in order to match the loop filter voltage Vc. Regulating the ground node is preferred to regulating VDD since all input signals are referenced to VDD, and small NFETs can be used in the regulating current source for the VCO and the XOR phase-detector cells.

The propagation delay of the delay stages of the VCO 100 can be digitally adjusted, which serves 2 purposes: First, it allows maximizing the swing in the VCO 100 for different process corners. Second, it allows adjusting the timing between data and edge samples to account for the fact that for a given channel the maximum vertical eye opening is not necessarily in the middle of the data eye.

In FIG. 11 an implementation of an adjustable delay stage 110 of signal generator according to the invention is illustrated. The inputs Vin and Vinb of an adjustable delay stage n are connected to the outputs of the previous adjustable delay stage n−1, while the inputs prev and prevb are connected to the outputs of an adjustable delay stage n−2. The inputs Vin and Vinb go into inverters 101 and the inputs prev and prevb into adjustable inverters 102, where at the output nodes the signals are blended. Thus, since the input signals prev and prevb change before Vin and Vinb, a speedup path is provided. Two small cross coupling inverters 103 and 104 are added to achieve pseudo-differential clock phases and to assure stable oscillation.

The transmission delay of the delay stage 110 can be adjusted by means of applying an offset signal offsX to the adjustable inverters 102.

FIG. 12 shows a schematic block diagram of a signal generator 120 according to a further embodiment of the invention. The signal generator 120 can be used for applications with an over-sampling factor M of 3, in other words for 3-times over-sampling.

The signal generator 120 comprises a ring oscillator 121 with 12 adjustable delay stages 122 to 133. The signal generator 120 is a differential or pseudo-differential signal generator.

The delay stages 122, 125, 128 and 131 establish a first group of delay stages, also denoted with "A". The delay stages 123, 126, 129 and 132 establish a second group of delay stages, also denoted with "B". The delay stages 124, 127, 130 and 133 establish a third group of delay stages, also denoted with "C".

The first group of delay stages comprises outputs for delivering a first set of output phases $\phi_0$, $\phi_{12}$, $\phi_3$, $\phi_{15}$, $\phi_6$, $\phi_{18}$, $\phi_9$, $\phi_{21}$. The second group of delay stages comprises outputs for delivering a second set of output phases $\phi_1$, $\phi_{13}$, $\phi_4$, $\phi_{16}$, $\phi_7$, $\phi_{19}$, $\phi_{10}$, $\phi_{22}$. The third group of delay stages comprises outputs for delivering a fourth set of output phases $\phi_2$, $\phi_{14}$, $\phi_5$, $\phi_{17}$, $\phi_8$, $\phi_{20}$, $\phi_{11}$, $\phi_{23}$. The output phases $\phi_1$, $\phi_{13}$, $\phi_4$, $\phi_{16}$, $\phi_7$, $\phi_{19}$, $\phi_{10}$, $\phi_{22}$ of the second group of delay stages are used as third set of output phases as well.

An adjustment circuit 140 is provided for adjusting the phase relationship by means of setting a first propagation delay $d_1$ for the first group of delay stages, a second propagation delay $d_2$ for the second group of delay stages and a third propagation delay $d_3$ for the third group of delay stages. The adjustment circuit 140 adjusts the first propagation delay $d_1$ by means of an offset signal offsA, the second propagation delay $d_2$ by means of an offset signal offsB and the third propagation delay $d_3$ by means of an offset signal offsC.

The first set of output phases $\phi_0$, $\phi_{12}$, $\phi_3$, $\phi_{15}$, $\phi_6$, $\phi_{18}$, $\phi_9$, $\phi_{21}$ is provided for delivering a first edge sampling clock signal to a sampling unit, the second set of output phases $\phi_1$, $\phi_{13}$, $\phi_4$, $\phi_{16}$, $\phi_7$, $\phi_{19}$, $\phi_{10}$, $\phi_{22}$ is provided for delivering a data sampling clock signal to a sampling unit, the fourth set of output phases $\phi_2$, $\phi_{14}$, $\phi_5$, $\phi_{17}$, $\phi_8$, $\phi_{20}$, $\phi_{11}$, $\phi_{23}$ 21 is provided for delivering a second edge sampling clock signal to a sampling unit and the third set of output phases $\phi_1$, $\phi_{13}$, $\phi_4$, $\phi_{16}$, $\phi_7$, $\phi_{19}$, $\phi_{10}$, $\phi_{22}$ is provided for delivering phase shifted output signals to a phase detector of a phase locked loop.

The disclosed embodiments may be combined with one or several of the other embodiments shown and/or described. This is also possible for one or more features of the embodiments.

Additional Embodiment Details

The described techniques may be implemented as a method, apparatus or article of manufacture involving software, firmware, micro-code, hardware and/or any combination thereof. The term "article of manufacture" as used herein refers to code or logic implemented in a medium, where such medium may comprise hardware logic [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CD-ROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.]. Code in the computer readable medium is accessed and executed by a processor. The medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed. Of course, those skilled in the art will recognize that many modifications may be made without departing from the scope of embodiments, and that the article of manufacture may comprise any information bearing medium. For example, the article of manufacture comprises a storage medium having stored therein instructions that when executed by a machine results in operations being performed.

Certain embodiments can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, certain embodiments can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself. Computer program means or computer program in the present context mean any expression, in any language, code or notation, of a set of instructions intended to cause a system having an information processing capability to perform a particular function either directly or after either or both of the following a) conversion to another language, code or notation; b) reproduction in a different material form.

The invention claimed is:

1. Signal generator for generating multiple phases, comprising
a ring oscillator with at least one first adjustable delay stage and at least one second delay stage being serially arranged, wherein an output of the first delay stage is provided for delivering at least one first output phase and an output of the second delay stage is provided for delivering at least one second output phase, and
an adjustment circuit for adjusting the delay of the first adjustable delay stage, wherein the adjustment circuit is provided for adjusting the phase relationship between the first output phase and the second output phase by means of setting a first propagation delay for the first delay stage.

2. Signal generator according to claim 1, wherein the second delay stage comprises an adjustable delay stage, wherein the adjustment circuit is provided for adjusting the delay of the first and the second adjustable delay stage and wherein the adjustment circuit is provided for adjusting the phase relationship between the first output phase and the second output phase by means of setting a first propagation delay for the first delay stage and a second propagation delay for the second delay stage.

3. Signal generator according to claim 1, wherein the first output phase is provided for delivering a data sampling clock signal to a sampling unit and the second output phase is provided for delivering an edge sampling clock signal to the sampling unit.

4. Signal generator according to claim 1, wherein the ring oscillator comprises a first group of adjustable delay stages and a second group of delay stages being serially arranged in an alternating way, wherein the output of the first group of delay stages is provided for delivering a first set of output phases and the output of the second group of delay stages is provided for delivering a second set of output phases, wherein the adjustment circuit is provided for adjusting the delay of the first group of adjustable delay stages, wherein the adjustment circuit is provided for adjusting the phase relationship between the first set of output phases and the second set of output phases by means of setting a first propagation delay for the first group of delay stages.

5. Signal generator according to claim 4, wherein the second group of delay stages comprises adjustable delay stages and wherein the adjustment circuit is provided for adjusting the delay of the first and the second group of adjustable delay stages, and wherein the adjustment circuit is provided for adjusting the phase relationship between the first set of output phases and the second set of output phases by means of setting a first propagation delay for the first group of delay stages and a second propagation delay for the second group of delay stages.

6. Signal generator according to claim 4, wherein the first group of delay stages or the second group of delay stages is provided for delivering a third set of output phases.

7. Signal generator according to claim 1, comprising at least one first pair of adjustable delay stages and at least one second pair of adjustable delay stages, wherein the output of the second delay stage of the first pair is provided for delivering a first set of output phases and the output of the second delay stage of the second pair is provided for delivering a second set of output phases, and wherein the output of the first delay stage of the first pair and the output of the first delay stage of the second pair is provided for delivering a third set of output phases.

8. Signal generator according to claim 6, wherein the third set of output phases is provided for generating multiple phase shifted output signals to a phase detector of a phase locked loop.

9. Signal generator according to claim 1, wherein the ring oscillator comprises three or more groups of adjustable delay stages being serially arranged in an alternating way, wherein the outputs of the three or more groups of adjustable delay stages are provided for delivering three or more sets of output phases, wherein the adjustment circuit is provided for adjusting the delay of the three or more groups of adjustable delay stages, and wherein the adjustment circuit is provided for adjusting the phase relationship between the three or more sets of output phases by means of setting different propagation delays for the three or more groups of adjustable delay stages.

10. Signal generator according to claim 1, wherein the ring oscillator is a differential ring oscillator.

11. A phase locked loop comprising as voltage controlled oscillator a signal generator comprising:
- a ring oscillator with at least one first adjustable delay stage and at least one second delay stage being serially arranged, wherein an output of the first delay stage is provided for delivering at least one first output phase and an output of the second delay stage is provided for delivering at least one second output phase, and
- an adjustment circuit for adjusting the delay of the first adjustable delay stage, wherein the adjustment circuit is provided for adjusting the phase relationship between the first output phase and the second output phase by means of setting a first propagation delay for the first delay stage.

12. Phase locked loop according to claim 11, wherein the voltage controlled oscillator is provided for generating multiple phase shifted output signals, wherein the phase locked loop further comprises
- multiple phase detectors to determine the phase differences between the output signals and a reference clock, and
- a weighting device to weight the phase differences and generating a control signal for the voltage controlled oscillator.

13. Clock and data recovery system comprising a phase locked loop comprising as voltage controlled oscillator a signal generator comprising:
- a ring oscillator with at least one first adjustable delay stage and at least one second delay stage being serially arranged, wherein an output of the first delay stage is provided for delivering at least one first output phase and an output of the second delay stage is provided for delivering at least one second output phase, and
- an adjustment circuit for adjusting the delay of the first adjustable delay stage, wherein the adjustment circuit is provided for adjusting the phase relationship between the first output phase and the second output phase by means of setting a first propagation delay for the first delay stage.

14. A receiver for a serial data link comprising the phase locked loop phase locked loop comprising as voltage controlled oscillator a signal generator comprising:
- a ring oscillator with at least one first adjustable delay stage and at least one second delay stage being serially arranged, wherein an output of the first delay stage is provided for delivering at least one first output phase and an output of the second delay stage is provided for delivering at least one second output phase, and
- an adjustment circuit for adjusting the delay of the first adjustable delay stage, wherein the adjustment circuit is provided for adjusting the phase relationship between the first output phase and the second output phase by means of setting a first propagation delay for the first delay stage.

* * * * *